(12) United States Patent
Suh

(10) Patent No.: US 7,423,318 B2
(45) Date of Patent: Sep. 9, 2008

(54) RECESSED GATE STRUCTURE WITH STEPPED PROFILE

(75) Inventor: Moon Sik Suh, Gyunggi-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 399 days.

(21) Appl. No.: 11/152,575

(22) Filed: Jun. 14, 2005

(65) Prior Publication Data

US 2006/0118889 A1    Jun. 8, 2006

(30) Foreign Application Priority Data

Dec. 3, 2004    (KR) .................. 10-2004-0101388

(51) Int. Cl.
*H01L 29/772* (2006.01)

(52) U.S. Cl. ................. 257/332; 257/E29.257; 438/286

(58) Field of Classification Search .......... 438/286
See application file for complete search history.

(56) References Cited

U.S. PATENT DOCUMENTS

| | | | |
|---|---|---|---|
| 5,064,777 A * | 11/1991 | Dhong et al. ............ | 438/242 |
| 6,399,978 B2 * | 6/2002 | Gruening et al. ........... | 257/301 |
| 6,686,637 B1 | 2/2004 | Dokumaci et al. | |
| 6,720,630 B2 | 4/2004 | Mandelman et al. | |
| 7,045,846 B2 * | 5/2006 | Jang et al. .................. | 257/306 |
| 2001/0001295 A1 * | 5/2001 | Odanaka et al. ............ | 438/259 |

* cited by examiner

*Primary Examiner*—Stephen W Smoot
(74) *Attorney, Agent, or Firm*—Marshall, Gerstein & Borun LLP

(57) ABSTRACT

Disclosed herein are a recess-gate structure in which junctions have a thickness significantly smaller than the thickness of a device isolation layer to thereby prevent shorting of the junctions located at opposite lateral sides of the device isolation layer close thereto, resulting in an improvement in the operational reliability of a resultant device, and a method for forming the same. The recess-gate structure comprises a silicon substrate in which an active region and a device isolation region are defined, a plurality of gates formed on the substrate, gate spacers formed at the side wall of the respective gates, and junctions formed in the substrate at opposite lateral sides of the gates and defining an asymmetrical structure relative to each other. A gate recess is defined in the active region of the substrate to have a stepped profile consisting of a bottom plane, top plane, and vertical plane. The bottom plane of the stepped gate recess exists in only the active region except for the device isolation region.

5 Claims, 6 Drawing Sheets

RECESSED GATE STRUCTURE WITH STEPPED PROFILE

CROSS-REFERENCE TO RELATED APPLICATION

The priority of Korean patent application No. 2004-101388 filed Dec. 3, 2004, the disclosure of which is incorporated herein by reference, is claimed.

BACKGROUND OF THE INVENTION

1. Field of the Invention

The present invention relates to a recess-gate structure and a method for forming the same, and more particularly, to a recess-gate structure in which the junctions have a thickness sufficiently smaller than the thickness of a device isolation layer to prevent shorting of the junctions located at opposite lateral sides of the device isolation layer close thereto, resulting in improvement in the operational reliability of a resultant device, and a method for forming the same.

2. Description of the Related Art

As the integration density of dynamic random access memory (DRAM) cells increases, transistors are gradually decreasing in size and the length of a channel between a source and a drain of transistors is also decreasing.

Such a decrease of the channel length exacerbates the short-channel effect of transistors, lowering a threshold voltage of transistors.

One proposal put forward to prevent the lowering of the threshold voltage due to the transistor's short-channel effect is to increase the dopant density in the channel until the threshold voltage reaches a desired level.

Increasing the dopant density, however, tends to concentrate electric fields on source junctions and to aggravate the leakage of current, resulting in a deterioration in the refresh characteristics of DRAM cells.

In an attempt to solve the above problem, research is underway to develop recess-gate structures.

A representative example of conventional recess-gate structures will be explained below in detail with reference of the accompanying drawing.

FIG. 1 illustrates a conventional recess-gate structure in section.

As shown in FIG. 1, the conventional recess-gate structure comprises a silicone substrate 100 in which an active region and a device isolation region are defined using a device isolation layer 105, a plurality of gates 300 formed on the substrate 100, gate spacers 160 each formed by sequentially stacking a buffer oxide layer 151 and a nitride layer 153 in that order on the side wall of the gate 300, and junctions 180 formed in the substrate 100 at opposite lateral sides of the respective gates 300 and defining an asymmetrical structure relative to each other.

Here, the junctions 180 form storage and bit line nodes, and therefore the storage and bit line nodes define an asymmetrical structure. This asymmetrical structure is effective to prevent the concentration of the electric fields on the storage nodes as source junctions and to improve the resistance characteristics of the bit line node.

In the conventional recess-gate structure described above, the gates 300 are formed in a recess having a stepped profile consisting of a bottom plane, top plane, and vertical plane. Referring to circle C shown in FIG. 1, the bottom plane of the stepped recess extends over the storage node and part of the device isolation layer 105 to eliminate a height difference between the bottom of the gate 300 formed on the device isolation layer 105 and the top of the junction 180 formed as the storage node in part of the active region close to the device isolation layer 105.

By virtue of such a gate recess having the stepped profile, the recess-gate structure of the prior art achieves an increased channel length, thereby effectively preventing a short-channel effect of transistors without increasing the dopant density in the channel.

However, because the bottom plane of the gate recess extends over the storage node and part of the device isolation layer adjacent to the storage node to eliminate the height difference between the gate and the junction, the height of the storage node is lowered to a value B far below an original design value A. That is, the junction as the storage node is lowered in height, and so the thickness of the junction is substantially equal to the thickness of the device isolation layer. This causes a problem of shorting between the junctions formed in the active region at opposite lateral sides of the device isolation layer close thereto (See dotted arrows shown in FIG. 1).

Additionally, in the gate recess having the stepped profile, the top plane thereof is offset from the bottom plane by the height of the vertical plane of the stepped profile. Thereby, during an etching process to form the gate recess, if the gate recess is etched based on the bottom plane by a predetermined etching slope, the top plane of the gate recess inevitably counters a relatively steep etching slope, causing damage to the junction adjacent thereto. Conversely, if the gate recess is etched based on the top plane by a predetermined etching slope, it results in a relatively dull etching slope on the bottom plane of the recess. This makes it impossible to accurately etch a material, which will form a gate electrode, to a desired depth, causing the residue of the etched material to remain on the substrate. The residue is problematic because it electrically connects adjacent gates.

If metal plugs are formed on the substrate without removing the residue of the gate electrode material, the resultant gates are also electrically connected with the metal plugs, preventing the gates from functioning as ON/OFF switches for the transistors.

SUMMARY OF THE INVENTION

Therefore, the present invention has been made in view of the above problems, and it is an object of the present invention to provide a recess-gate structure in which junctions have a thickness sufficiently smaller than the thickness of a device isolation layer, thereby preventing shorting of the junctions located at opposite lateral sides of the device isolation layer close thereto, and a method for forming the same.

In accordance with one aspect of the present invention, the above and other objects can be accomplished by the provision of a recess-gate structure comprising: a silicon substrate in which an active region and a device isolation region are defined; a plurality of gates formed on the substrate; gate spacers formed at the side wall of the respective gates; and junctions formed in the substrate at opposite lateral sides of the gates and defining an asymmetrical structure relative to each other, wherein a gate recess is defined in the active region of the substrate to have a stepped profile consisting of a bottom plane, top plane, and vertical plane, the bottom plane of the stepped gate recess existing in only the active region except for the device isolation region.

Preferably, the bottom and top planes of the stepped gate recess may have the same area as each other.

Preferably, the bottom plane may be wider than the top plane.

Preferably, the vertical plane of the stepped gate recess may have an inclination of 10-90°, and a height of 50-2500 angstroms.

In accordance with another aspect of the present invention, the above and other objects can be accomplished by the provision of a method for forming a recess-gate structure comprising: dividing a silicon substrate into an active region and a device isolation region; forming a gate recess having a stepped profile, in which a plurality of gates will be formed, by etching part of the active region of the silicon substrate to a predetermined depth; implanting primary ions for adjusting a threshold voltage into the silicon substrate; forming the plurality of gates on the silicon substrate so that a specific number of gates on the active region are positioned to correspond to the boundary of the stepped gate recess; applying an ion implantation mask over the silicon substrate, where the plurality of gates are formed, to cover storage nodes while exposing a bit line node; implanting secondary ions for adjusting the threshold voltage by means of the ion implantation mask; removing the ion implantation mask; and implanting ions, as impurities, into the substrate after the removal of the ion implantation mask, forming asymmetrical junctions.

Preferably, the stepped profile of the gate recess consists of a bottom plane, top plane, and vertical plane, Preferably, the bottom and top planes of the stepped gate recess may have the same area as each other, or the bottom plane may be wider than the top plane.

Preferably, the vertical plane of the stepped gate recess has an inclination of 10-90°, and a height of 50-2500 angstroms.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
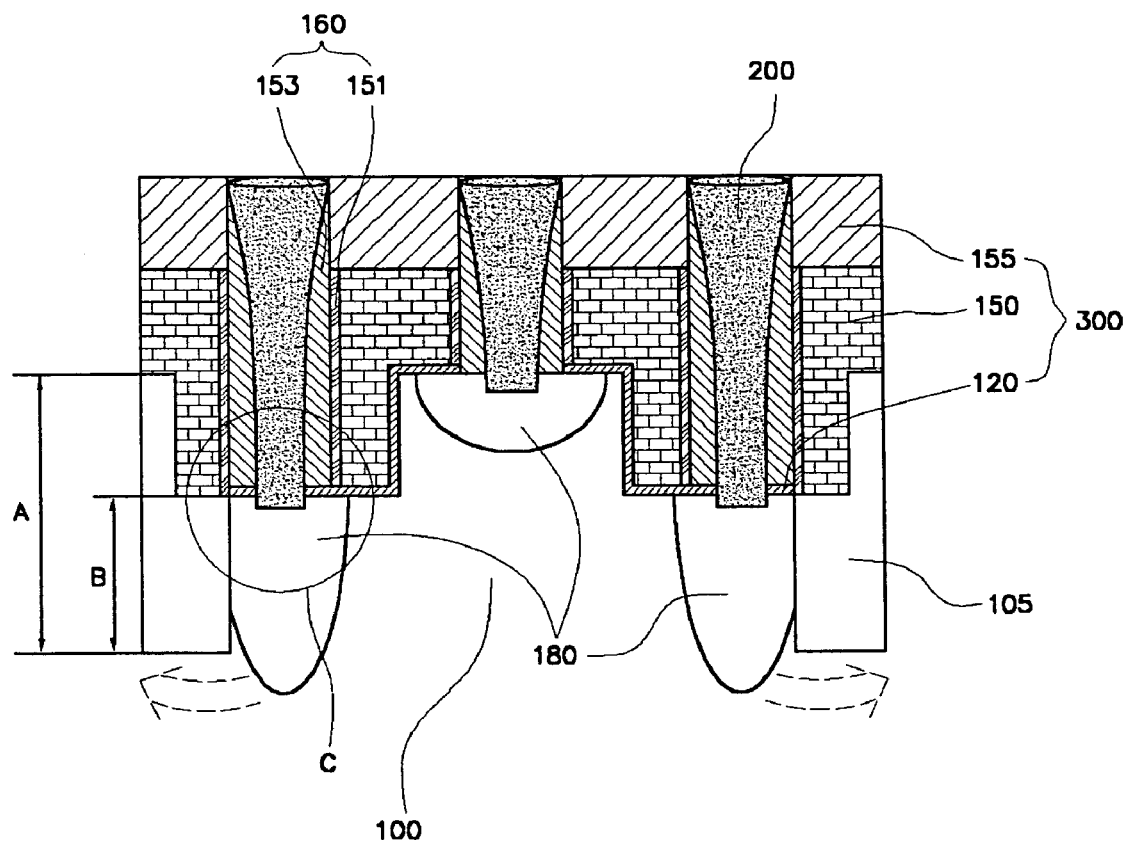
FIG. 1 is a sectional view illustrating a conventional recess-gate structure.

A preferred exemplary embodiment of the present invention will be described in detail to permit those skilled in the art to easily practice the present invention with reference to the accompanying drawings. It should be understood that the following description of the embodiment is only an example, and, as such, may be variously modified, and the scope of the present invention is not limited to the following description of the embodiment.

In the accompanying drawings, respective layers and regions are exaggerated in their dimensions for clarity of understanding, and like reference numerals refer to like elements throughout.

Now, a method for forming a recess-gate structure according to a preferred exemplary embodiment of the present invention will be explained in detail with reference to FIGS. 2 to 4.

Prior to explaining the forming method, the recess-gate structure according to the preferred exemplary embodiment of the present invention will be explained with reference to FIG. 2.

Figure 2:
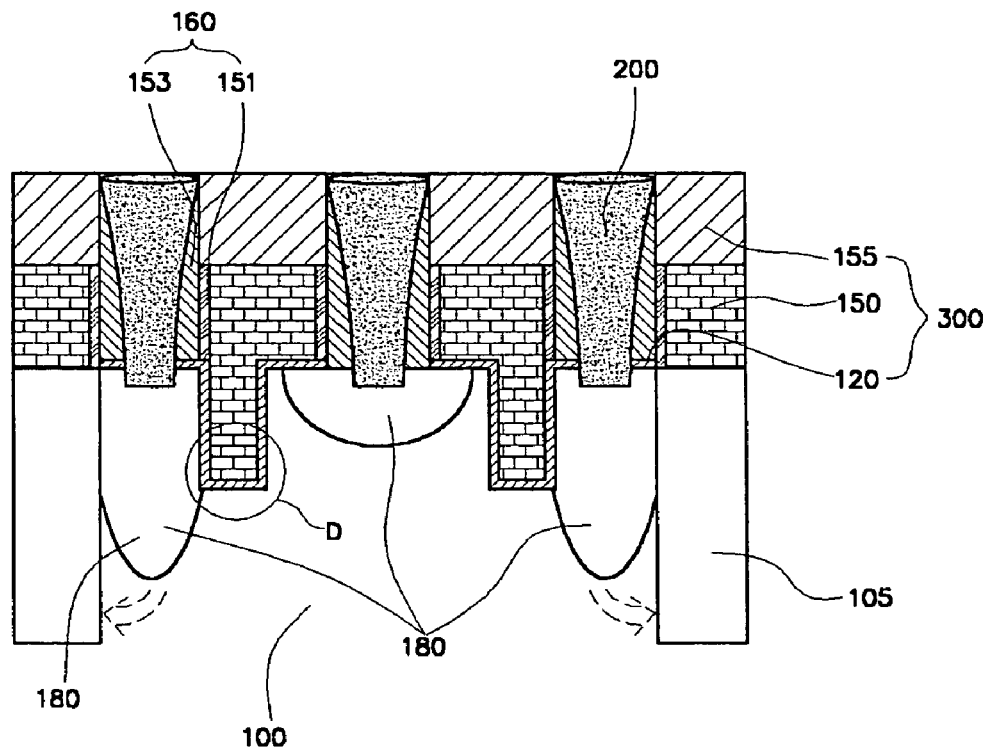
FIG. 2 is a sectional view illustrating a recess-gate structure according to an embodiment of the present invention.

Referring to FIG. 2 illustrating the recess-gate structure according to the embodiment of the present invention in section, the recess-gate structure comprises a silicone substrate 100 in which an active region and a device isolation region are defined using a device isolation layer 105, a plurality of gates 300 formed on the substrate 100, gate spacers 160 each formed by sequentially stacking a buffer oxide layer 151 and a nitride layer 153 in that order on the side wall of the gate 300, and junctions 180 formed in the substrate 100 at opposite lateral sides of the respective gates 300 close thereto and defining an asymmetrical structure relative to each other.

The gates 300 are formed in a gate recess having a stepped profile consisting of a bottom plane, top plane and vertical plane. Referring to circle D shown in FIG. 2, the stepped recess is defined by etching only part of the active region of the substrate 100, where the gates will be formed. Thereby, the bottom plane of the stepped recess is not formed on the device isolation layer, and is defined in the remaining part of the active region except for storage and bit line nodes included in the active region. This allows the device isolation layer to have a sufficient thickness to insulate adjacent devices, and to provide the storage and bit line nodes, referred to as junctions, with a sufficient height to prevent shorting of the junctions at opposite lateral sides of the device isolation layer close thereto.

As stated above, in the exemplary embodiment of the present invention, the substrate 100 is partially etched in part of the active region adjacent to the storage nodes to form the gate recess having the stepped profile. Meanwhile, although not shown, the substrate 100 may be etched in part of the active region adjacent to the bit line node to form the gate recess having the stepped profile.

In summary, the recess-gate structure according to the exemplary embodiment of the present invention described above is designed such that the junctions as the storage nodes formed in part of the active region close to the device isolation layer are increased in height as compared to the prior art. This has the effect of substantially preventing shorting of the junctions at opposite lateral sides of the device isolation layer close thereto (See dotted arrows shown in FIG. 2).

Now, a method for forming the recess-gate structure according to the exemplary embodiment of the present invention will be explained with reference to FIGS. 3a to 3f.

FIGS. 3a to 3f illustrate sequential processes of the method for forming the recess-gate structure of FIG. 2.

Figure 3A:
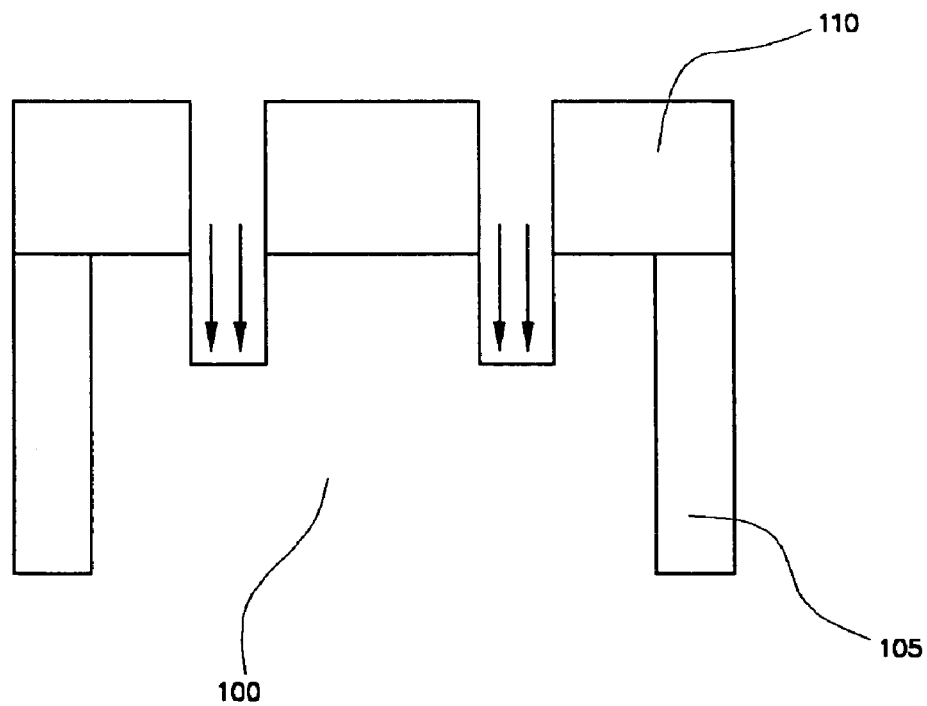
FIGS. 3a to 3f are sectional views illustrating sequential processes of a method for forming the recess-gate structure of FIG. 2.

First, as shown in FIG. 3a, a mask 110, which is used to etch the gate recess having the stepped profile, namely, a step gate mask, is applied to the substrate 100 in which the active region and the device isolation region are defined using the device isolation layer 105. Here, the step gate mask 110 is made of a material selected from among photosensitive film, oxide film, nitride film, poly-silicon, etc. Preferably, the step gate mask 110 has a width at least as wide as 10% of the width of the resultant gate recess or a length equal to 10% of the length of the gate. This is to protect the gate from excessive etching and to achieve a uniform gate width.

Then, the substrate 100 is etched in part of the active region thereof by means of the step gate mask 110 as an etching mask to form the stepped gate recess having a predetermined depth.

In the exemplary embodiment of the present invention described above, the stepped gate recess is etched in part of the active region of the substrate 100 close to the storage nodes. Meanwhile, although not shown, the stepped gate recess may be defined in part of the active region of the substrate 100 close to the bit line node.

In the stepped gate recess consisting of the bottom plane, top plane, and vertical plane, especially, the bottom plane of the stepped gate recess is not formed in the device isolation region filled with the device isolation layer, and is defined in only part of the active region of the substrate, where the gates will be formed, thereby allowing the device isolation layer to have a sufficient thickness to insulate adjacent devices. Further, this allows the height of the junctions as the storage nodes formed in part of the active region close to the device isolation layer to increase as compared to the prior art, thereby eliminating the risk of shorting of the junctions at opposite lateral sides of the device isolation layer close thereto.

The finished gate recess etched in the substrate has a depth of 50-2500 angstroms and an inclination of 10-90°. With such dimensions, the lateral wall of the gate recess serves as a barrier capable of intercepting diffusion of ions during a following thermal process, thereby maximizing advantageous effects obtained from the asymmetrical junctions.

Figure 3B:
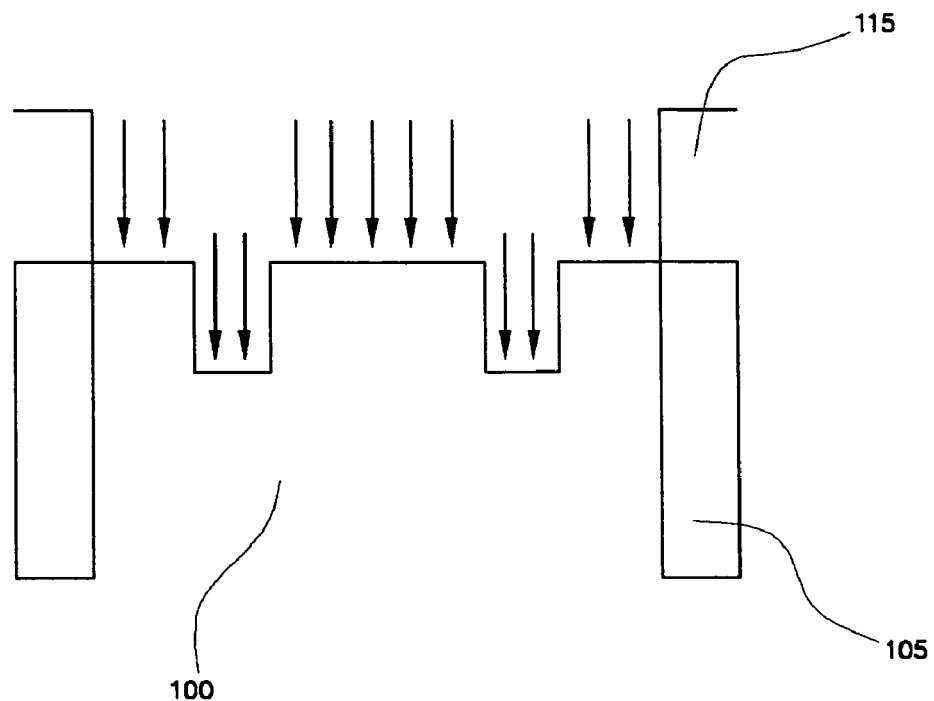

Second, after the step gate mask 100 is removed, as shown in FIG. 3b, a mask 115, for exposing regions in which wells are formed, namely, a well mask, is applied to the device isolation layer 105. Then, ions are implanted into the active region of the silicon substrate 100 exposed by the well mask 115. Here, the implanted ions are p-type ions as primary ions for adjusting a threshold voltage.

Figure 3C:
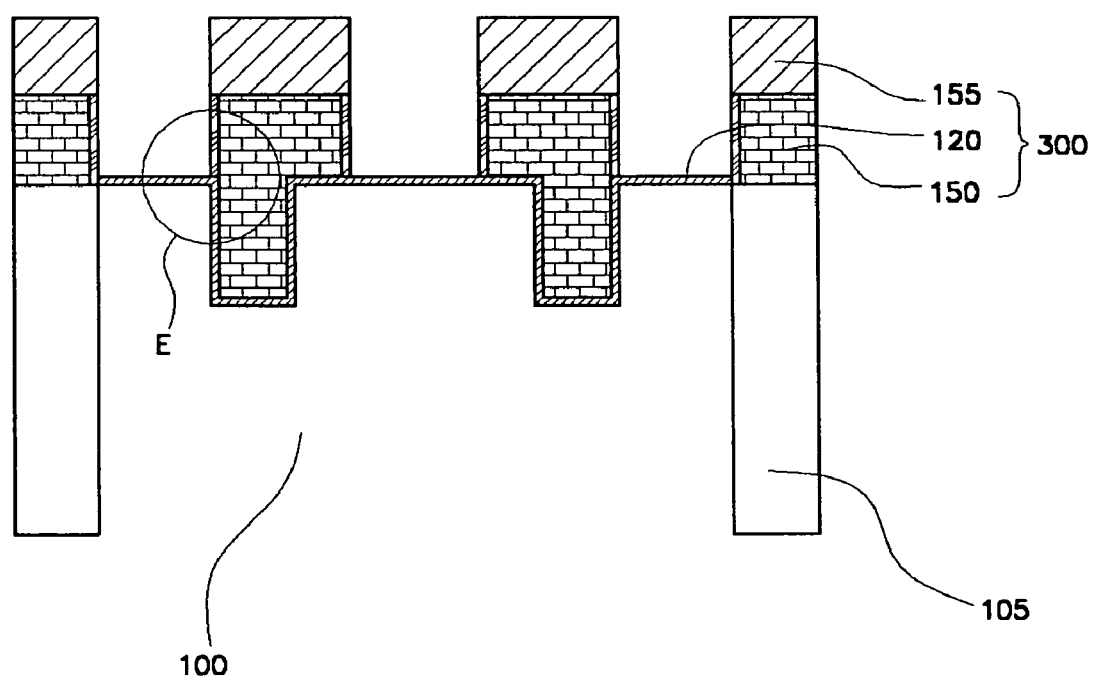

Third, after removal of the well mask 115, as shown in FIG. 3c, a plurality of gates 300 are formed in the stepped gate recess etched in the silicon substrate 100 by way of a general gate stacking process. The gates 300 each take the form of a gate stack consisting of a gate oxide layer 120, a gate conductive layer 150 and a hard mask 155. One respective gate 300 formed on the active region of the substrate 100 is positioned to correspond to the boundary of the stepped gate recess close to the storage node (not shown), as designated by circle E shown in FIG. 3c. This has the effect of eliminating the leakage of current.

Then, an oxidation process is performed on the side wall of the respective gates to form a buffer oxide layer 151 thereon. The buffer oxide layer 151 serves to protect the side wall of the gate.

Figure 3D:
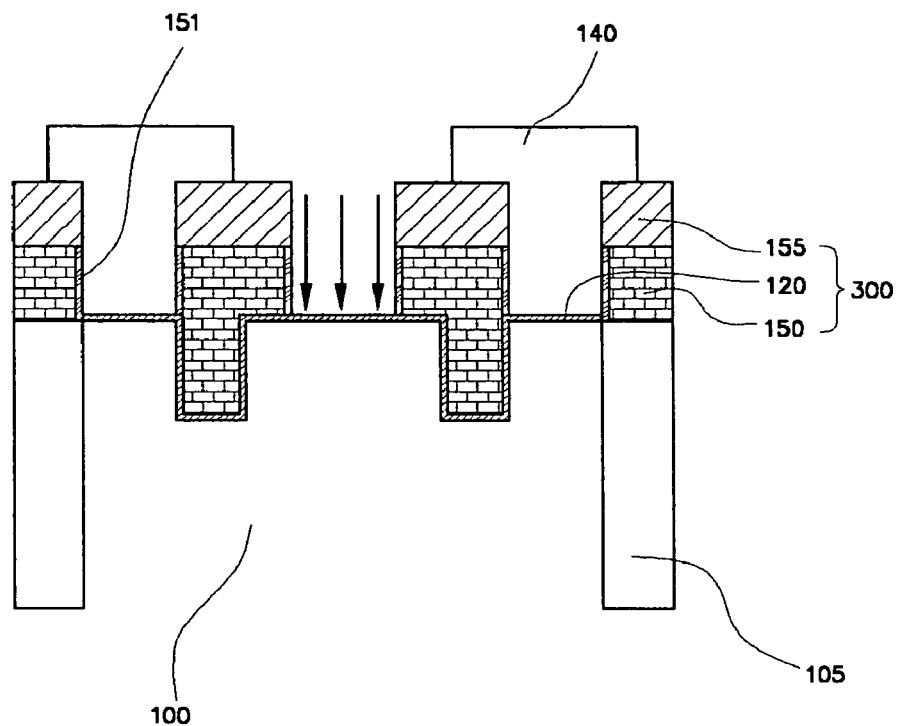

Fourth, as shown in FIG. 3d, an ion implantation mask 140 is applied over the plurality of gates 300 formed on the substrate 100 to cover the storage nodes (not shown) while exposing the bit line node (not shown). In this way, the resultant junctions have an asymmetrical structure relative to each other, as will be explained hereinafter. Then, ions are implanted into the bit line node (not shown) exposed by the ion implantation mask 140. Here, the implanted ions, as secondary ions for adjusting the threshold voltage, are the same p-type ions as the primary ions.

The reason why the secondary ions for adjusting the threshold voltage are implanted into only the bit line node is to differentiate the density of the bit line node from the storage nodes. That is, the density of the p-type ions implanted in the bit line node is higher than that of the storage nodes, maximizing the asymmetrical characteristics of the resultant junctions.

Figure 3E:
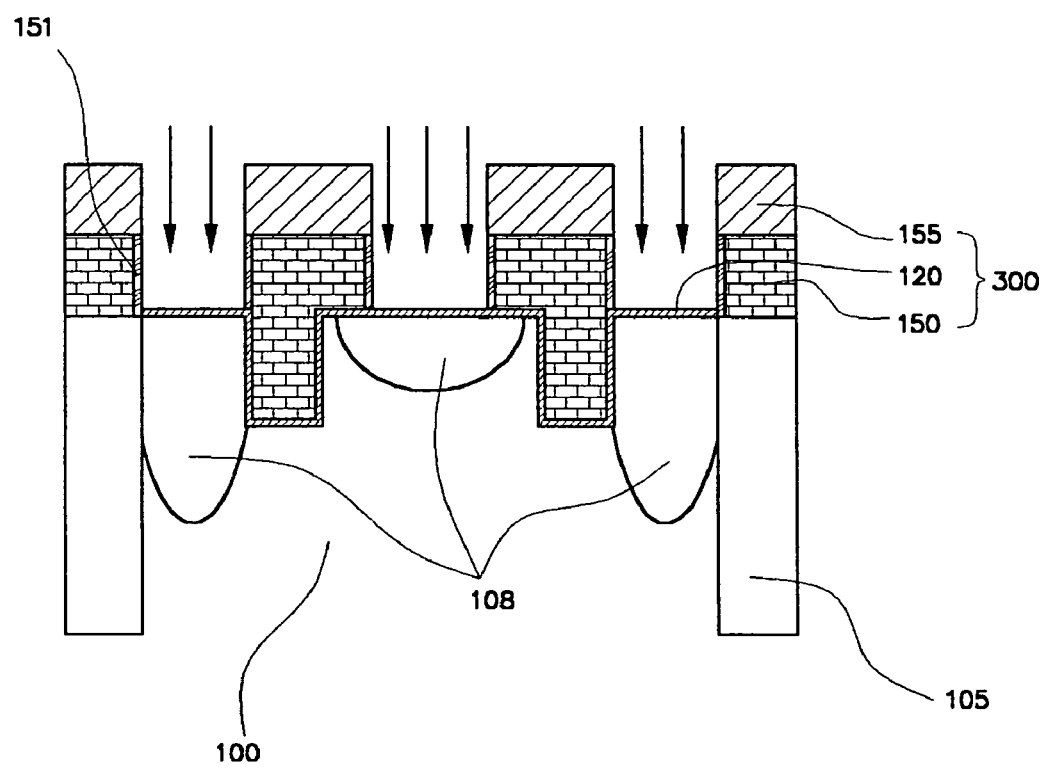

Fifth, after the ion implantation mask 140 is removed, as shown in FIG. 3e, impurities, i.e. n-type ions, are implanted onto the substrate 100 to complete source/drain junctions. As will be expected, implanting the n-type ions as impurities to the substrate, in which the p-type ions are doped at high density in the bit line node, allows the storage nodes, which are slightly doped with the p-type ions, to show the high density of the n-type ions. That is, the density of the n-type ions implanted in the storage nodes is higher than that of the bit line node. This is effective to improve the resistance characteristics of the bit line node.

Figure 3F:
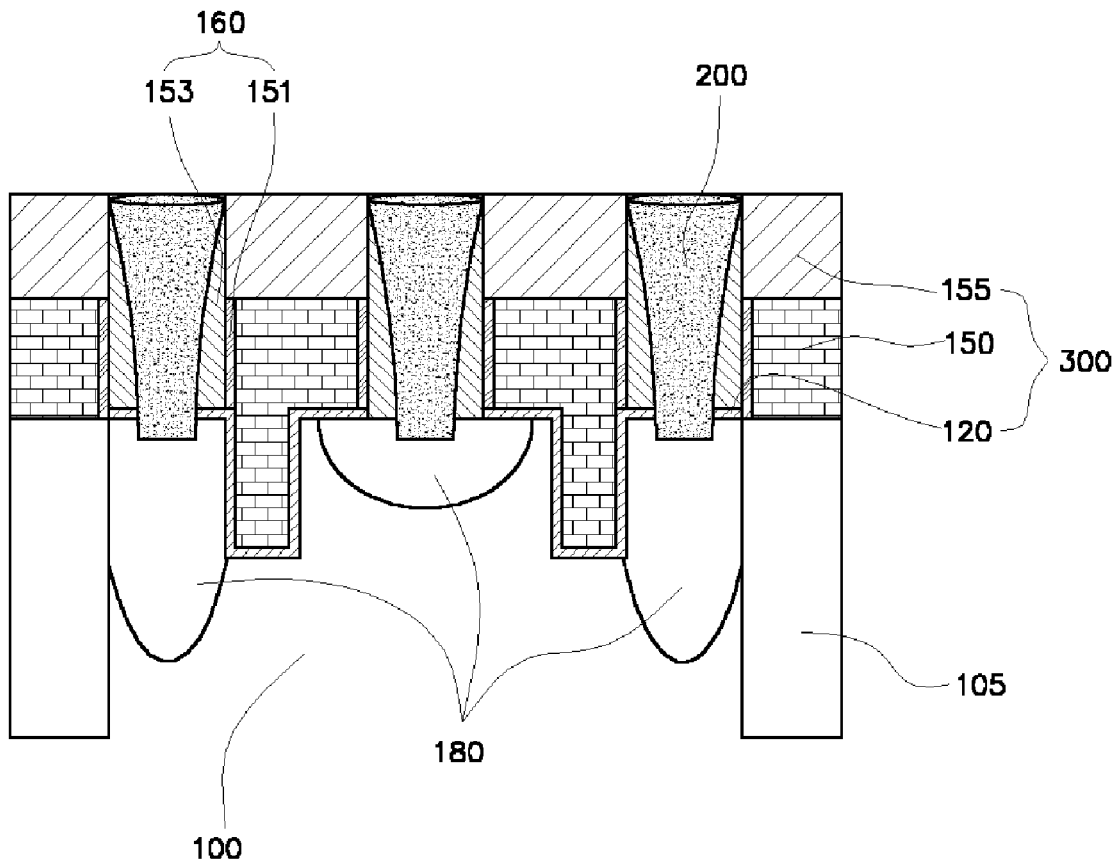

Finally, as shown in FIG. 3f, the nitride layer 153 is formed around the buffer oxide layer 151 to complete the gate spacer 160 capable of protecting the gate 300 from following etching and washing processes. Then, metal plugs 200 are formed in the respective gate spacers 160 to be connected to the bit line or storage nodes.

Figure 4A:
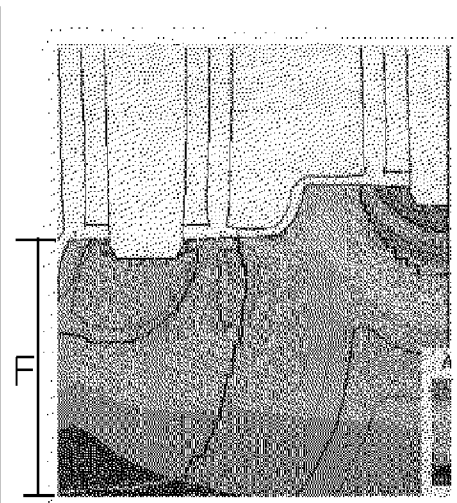
FIGS. 4a and 4b are comparative views illustrating the distribution of electric fields of different transistors, FIG. 4a illustrating the electric field of a transistor having the conventional recess-gate structure, FIG. 4b illustrating the electric field of a transistor having the recess-gate structure according to the exemplary embodiment of the present invention.
Figure 4B:
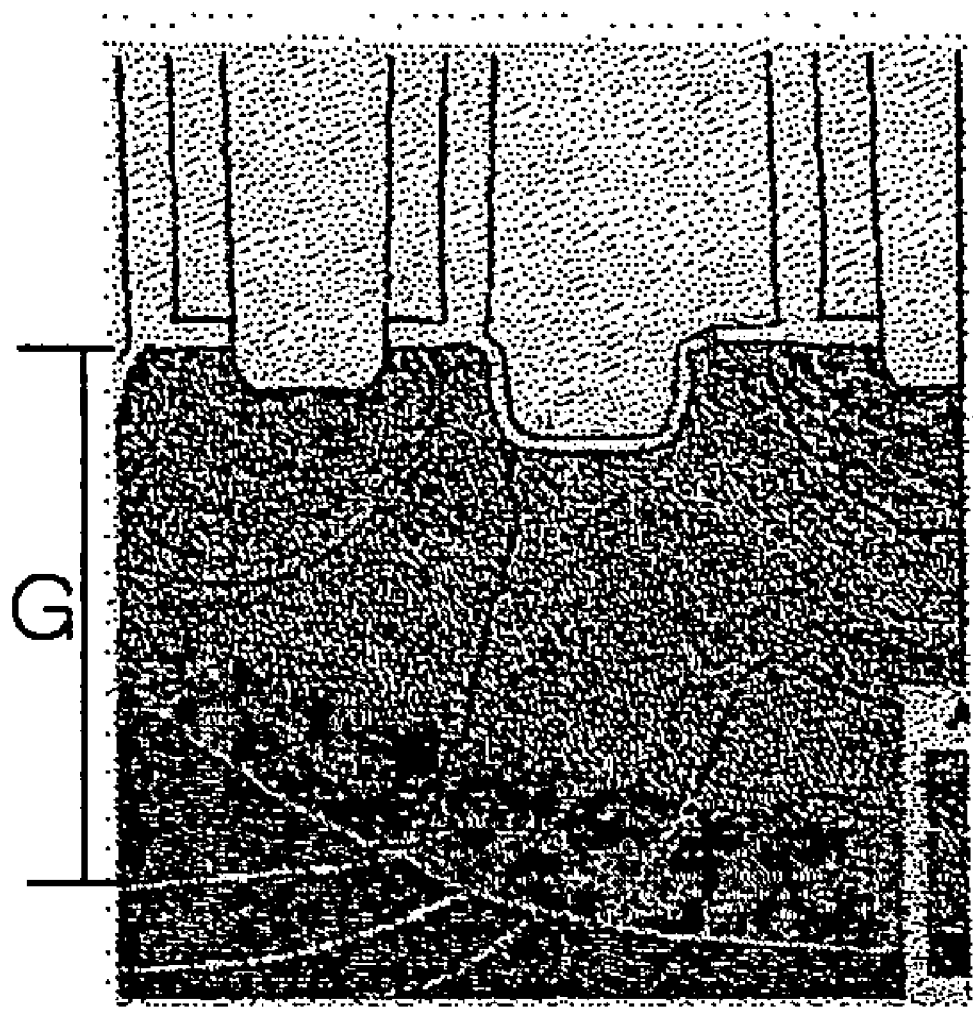

Now, a transistor having the recess-gate structure according to the exemplary embodiment of the present invention will be compared and explained with a transistor having a conventional recess-gate structure with reference to FIGS. 4a and 4b.

FIG. 4a illustrates the electric field of the transistor having the conventional recess-gate structure, while FIG. 4b illustrates the electric field of a transistor having the recess-gate structure of the present invention.

Referring to FIG. 4a illustrating the prior art, in order to eliminate the height difference between the bottom of the gate formed on the device isolation layer and the top of the junction formed in part of the active region close to the device isolation layer, the device isolation layer is partially etched and is lowered in thickness, and correspondingly, the active region is lowered in thickness. This means that junction formed in the active region has a lower thickness as clearly indicated by reference numeral F shown in FIG. 4a.

Referring to FIG. 4b illustrating the present invention, because the substrate is etched in only part of the active region, where gates will be formed, to form a gate recess having a stepped profile, the remaining part of the active region close to the device isolation layer is not lesthick, and consequently, the junction formed thereon has an increased thickness as compared to the prior art, as clearly indicated by reference numeral G shown in FIG. 4b.

As apparent from the above description, the present invention provides a recess-gate structure and a method for forming the same, which can achieve asymmetrical junctions, thereby improving the resistance characteristics of a bit line node and stabilizing a resultant device.

Further, according to the present invention, the thickness in part of an active region, where the junctions are formed, increases, thereby preventing shorting of the junctions formed in the active region at opposite lateral sides of the device isolation layer close thereto. This consequently has the effect of improving the operational reliability of the device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A recess-gate structure comprising:
   a substrate having an active region and a device isolation region, wherein recesses are formed in the active region, and a first active region between the recesses and a second active region between the recess and the device isolation region are defined;
   a plurality of gates formed on the substrate, wherein the gates in the active region fill the recesses and overlap with a part of the first active region; and first and second junctions with asymmetrical structures relative to each other, wherein the first junction is formed in the first active region of the substrate and the second junction is formed in the second active region of the substrate.

2. The structure as set forth in claim 1, wherein bottom and top planes of the gate recesses have the same area as each other.

3. The structure as set forth in claim 1, wherein a bottom plane of the gate recesses is wider than a top plane of the gate recesses.

4. The structure as set forth in claim 1, wherein a vertical plane of the gate recesses has an inclination of 10-90°.

5. The structure as set forth in claim 1, wherein a vertical plane of the gate recesses has a height of 50-2500 angstroms.

* * * * *